(12) United States Patent
Phillips et al.

(10) Patent No.: US 12,410,538 B2
(45) Date of Patent: Sep. 9, 2025

(54) USE OF ARRAYS OF QUARTZ PARTICLES DURING SINGLE CRYSTAL SILICON INGOT PRODUCTION

(71) Applicant: GlobalWafers Co., Ltd., Hsinchu (TW)

(72) Inventors: Richard Joseph Phillips, St. Peters, MO (US); Carissima Marie Hudson, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 135 days.

(21) Appl. No.: 17/964,303

(22) Filed: Oct. 12, 2022

(65) Prior Publication Data
US 2023/0142194 A1    May 11, 2023

Related U.S. Application Data

(60) Provisional application No. 63/276,969, filed on Nov. 8, 2021.

(51) Int. Cl.
| | |
|---|---|
| *C30B 15/02* | (2006.01) |
| *C30B 15/00* | (2006.01) |
| *C30B 15/12* | (2006.01) |
| *C30B 29/06* | (2006.01) |

(52) U.S. Cl.
CPC ............ *C30B 15/02* (2013.01); *C30B 15/002* (2013.01); *C30B 15/12* (2013.01); *C30B 29/06* (2013.01)

(58) Field of Classification Search
CPC ......... C30B 15/04; C30B 15/02; C30B 15/10; C30B 15/002; Y10T 117/1056
See application file for complete search history.

(56) References Cited

U.S. PATENT DOCUMENTS

| | | | | |
|---|---|---|---|---|
| 5,871,581 | A | * | 2/1999 | Atami ................ C30B 15/12 |
| | | | | 117/214 |
| 2019/0153615 | A1 | * | 5/2019 | Zepeda ............... C30B 15/20 |
| 2022/0145491 | A1 | | 5/2022 | Phillips et al. |
| 2022/0205129 | A1 | | 6/2022 | Pannocchia et al. |
| 2022/0389609 | A1 | | 12/2022 | Pannocchia et al. |

FOREIGN PATENT DOCUMENTS

| | | | | |
|---|---|---|---|---|
| JP | H0585876 | A * | 4/1993 | ............ C30B 15/00 |
| WO | WO-2018002001 | A1 * | 1/2018 | ............ C03B 19/01 |

OTHER PUBLICATIONS

Luo et al., "Additive Manufacturing of Glass", Journal of Manufacturing Science and Engineering, Dec. 2014, vol. 136, <http://manufacturingscience.asmedigitalcollection.asme.org>, 6 pages.
Witzendorff et al., "Additive manufacturing of glass: CO2-Laser glass deposition printing", Procedia CIRP 74, 2018, pp. 272-275, Elsevier Ltd.

* cited by examiner

*Primary Examiner* — Matthew J Song
(74) *Attorney, Agent, or Firm* — Armstrong Teasdale LLP

(57) ABSTRACT

Methods for producing single crystal silicon ingots in which an array of quartz particles are added to the crucible assembly before ingot growth are disclosed. The array may be disposed in the outer melt zone of the crucible assembly as in a continuous Czochralski (CCz) process. The array may be made of quartz particles that are interconnected by linking members.

20 Claims, 15 Drawing Sheets

USE OF ARRAYS OF QUARTZ PARTICLES DURING SINGLE CRYSTAL SILICON INGOT PRODUCTION

CROSS-REFERENCE TO RELATED APPLICATION

This application claims the benefit of U.S. Provisional Patent Application No. 63/276,969, filed Nov. 8, 2021, which is incorporated herein by reference in its entirety.

FIELD OF THE DISCLOSURE

The field of the disclosure relates to methods for producing single crystal silicon ingots by Continuous Czochralski (CCz) and, in particular, methods in which an array of quartz particles are added to the crucible assembly before ingot growth.

BACKGROUND

Continuous Czochralski (CCz) is well suited to form 300 mm or 200 mm diameter single crystal silicon ingots such as ingots that are relative heavily doped with arsenic or phosphorous. Continuous Czochralski methods involve forming a single crystal silicon ingot from a melt of silicon while continuously or intermittently adding solid polycrystalline silicon to the melt to replenish the melt while the ingot is grown. The methods may involve forming multiple ingots from the same melt while the hot zone remains at temperature (i.e., with a melt continuously being present in the crucible assembly while the plurality of ingots is grown).

Customers increasingly expect that wafers grown by continuous Czochralski have the same relatively low void count as wafers grown by standard batch Czochralski. Continuous Czochralski methods may involve a crucible assembly that includes at least two and often three melt zones that are separated by physical barriers—an outer melt zone into which solid polycrystalline silicon is fed, a middle melt zone in which the melt stabilizes, and an inner melt zone from which the silicon ingot is pulled. Addition of solid polycrystalline silicon to the melt causes inert gas bubbles (e.g., argon bubbles) to form in the melt which impacts the void count.

A need exists for methods for forming silicon ingots which reduce the defect count in silicon wafers sliced from the ingot and/or which promote dissipation of the inert gas bubbles.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for forming a single crystal silicon ingot. Solid-phase polycrystalline silicon is added to a crucible assembly. An array of quartz particles is added to the crucible assembly. The array includes a plurality of quartz particles and a plurality of linking members that interconnect the quartz particles. The polycrystalline silicon is heated to form a silicon melt. The silicon melt is contacted with a seed crystal. The seed crystal is withdrawn from the silicon melt to form a silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for growing a single crystal silicon ingot in a continuous Czochralski (CCz) process. An array of quartz particles is added to the crucible assembly. The array may be made of quartz particles that are connected in the array by linking members. The array may be placed in the crucible assembly with solid polycrystalline silicon prior to melt-down.

Figure 4:
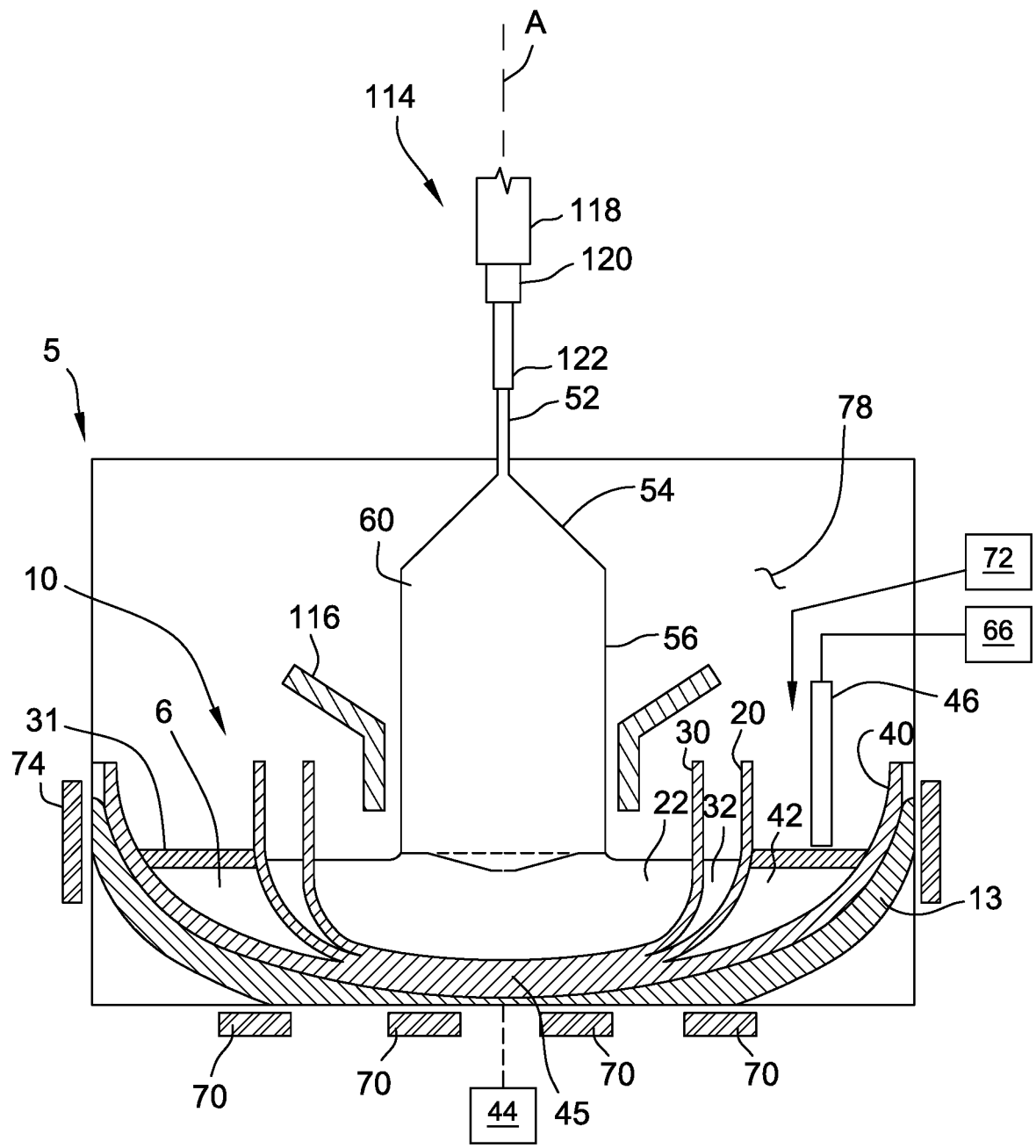
FIG. 4 is a cross-section view of the ingot puller apparatus showing a silicon ingot being pulled from the silicon melt.

An example ingot puller apparatus 5 for producing an ingot 60 by a continuous Czochralski process is shown in FIG. 4. The ingot puller apparatus 5 includes a crucible assembly 10 that contains a melt 6 of semiconductor or solar grade silicon material. A susceptor 13 supports the crucible assembly 10. The crucible assembly 10 has a sidewall 40 and one or more fluid barriers 20, 30 or "weirs" that separate the melt into different melt zones. In the illustrated embodiment, the crucible assembly 10 includes a first weir 20. The first weir 20 and sidewall 40 define an outer melt zone 42 of the silicon melt 6 and crucible assembly 10. The crucible assembly 10 includes a second weir 30 radially inward to the first weir 20 which defines an inner melt zone 22 of the silicon melt and crucible assembly 10. The inner melt zone 22 is the growth region from which the single crystal silicon ingot 60 is grown. The first weir 20 and a second weir 30 define a middle melt zone 32 of the crucible assembly 10 and silicon melt in which the melt 6 may stabilize as it moves toward the inner melt zone 22. The first and second weirs 20, 30 each have at least one opening defined therein to permit molten silicon to flow radially inward towards the growth region of the inner melt zone 22.

In the illustrated embodiment, the first weir 20, second weir 30, and sidewall 40 each have a generally annular shape. The first weir 20, second weir 30, and sidewall 40 may be part of three nested crucibles which are joined at the bottom or floor 45 of the crucible assembly 10 (i.e., the first and second weirs 20, 30 are the sidewalls of two crucibles nested within a larger crucible). The crucible assembly configuration depicted in FIGS. 1-4 is exemplary. In other embodiments, the crucible assembly 10 has a single layer floor (i.e., does not have nested crucibles) with the weirs extending upward from the floor 45. Optionally, the floor 45 may be flat rather than curved and/or the weirs 20, 30 and/or sidewall 40 may be straight-sided. Further, while the illustrated crucible assembly 10 is shown with two weirs, in other embodiments the crucible assembly may have a single weir or even no weirs.

A feeding tube 46 feeds polycrystalline silicon which may be, for example, granular, chunk, chip, or a combination of thereof, into the outer melt zone 42 at a rate sufficient to maintain a substantially constant melt elevation level and volume during growth of the ingot 60.

Figure 1:
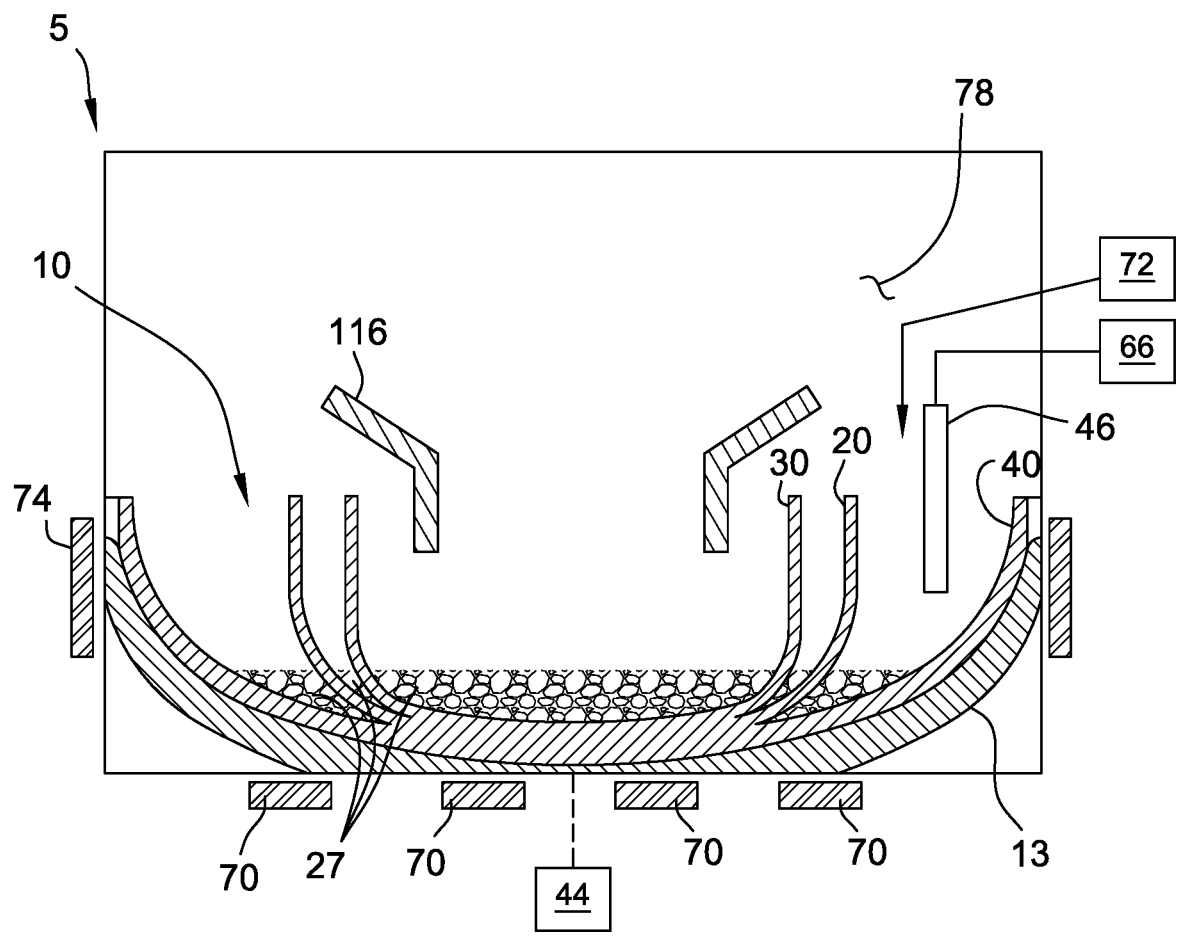
FIG. 1 is a cross-section view of an example ingot puller apparatus having a solid polycrystalline silicon charge disposed therein.
Figure 2:
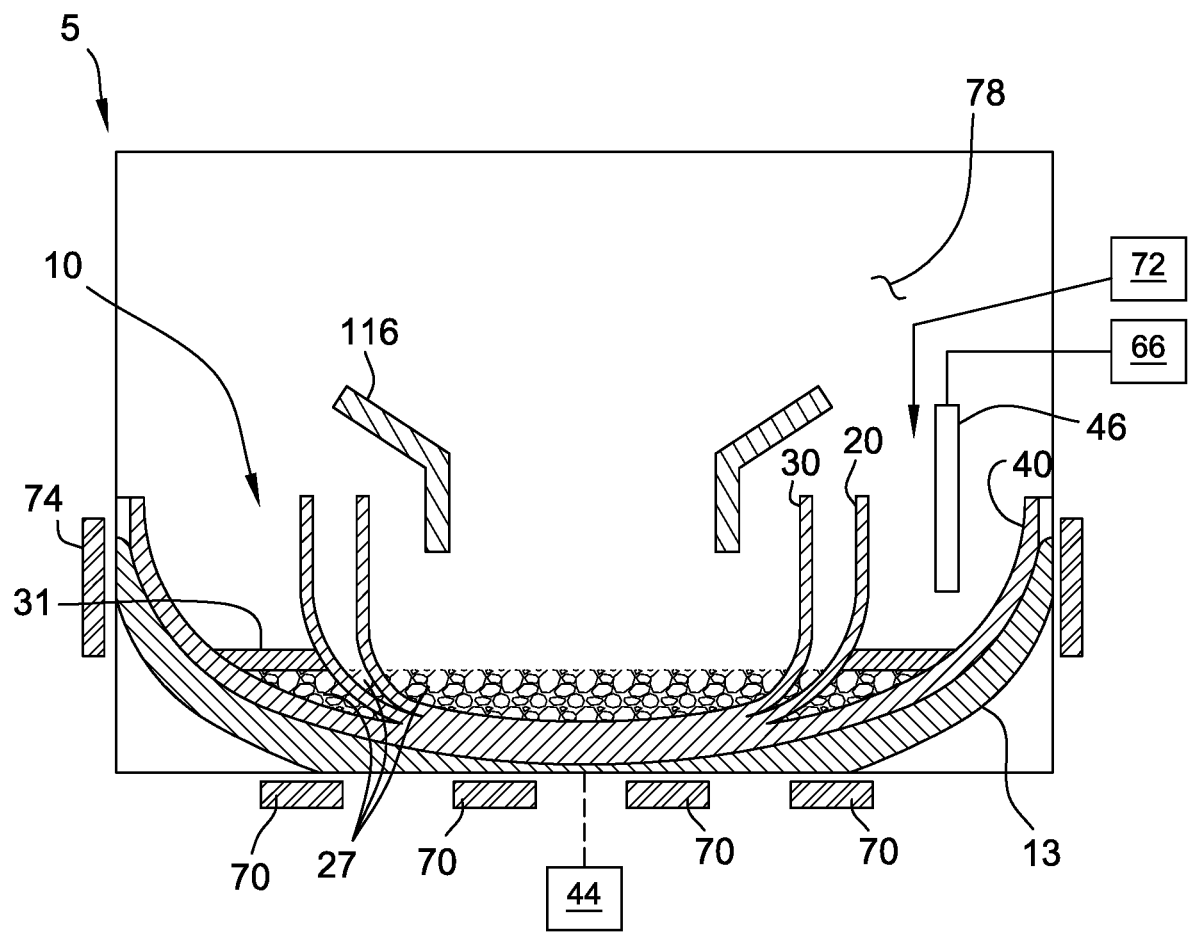
FIG. 2 is a cross-section view of the ingot puller apparatus having an array of quartz particles disposed on the surface of the polycrystalline silicon charge.
Figure 3:
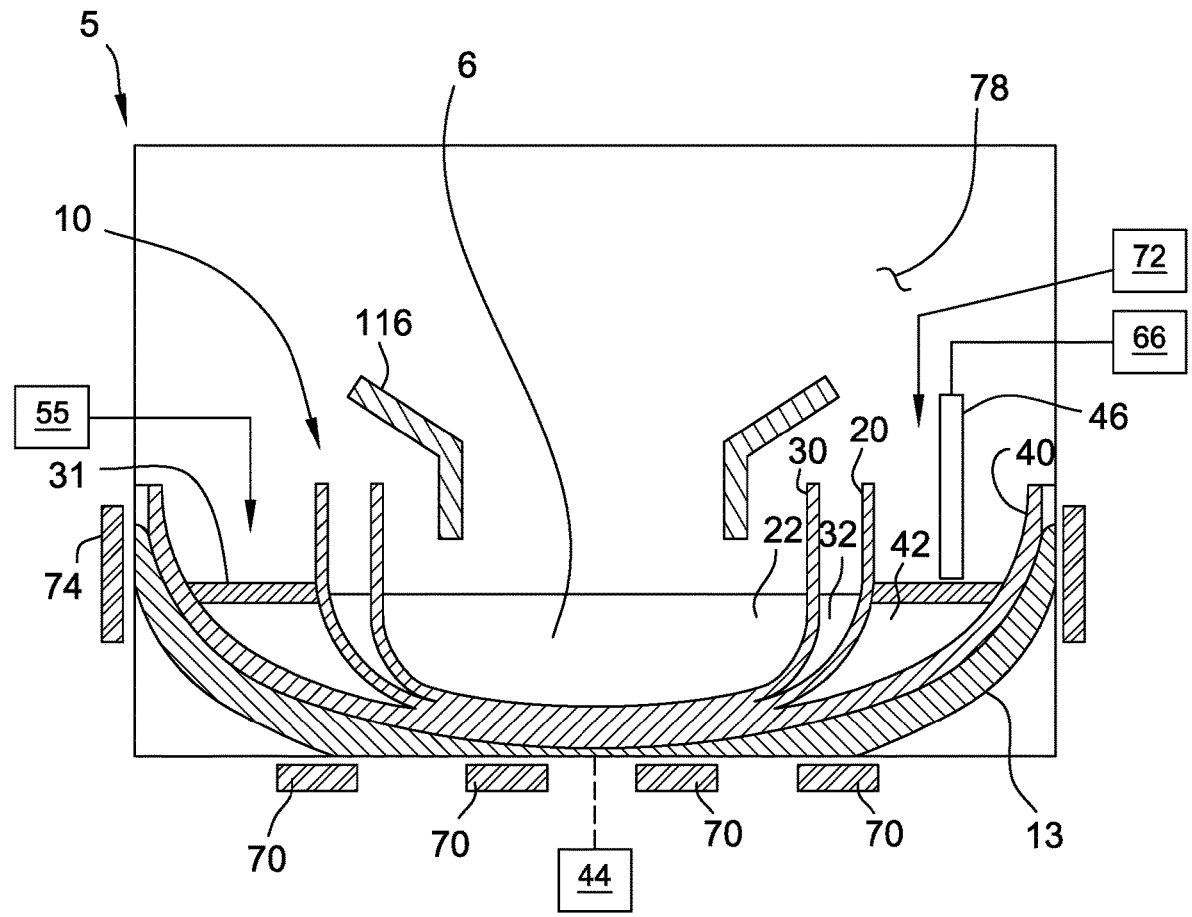
FIG. 3 is a cross-section view of the ingot puller apparatus having a melt disposed within the crucible assembly with the array being disposed within the melt.

Generally, the melt 6 from which the ingot 60 is drawn is formed by loading polycrystalline silicon into a crucible to form an initial silicon charge 27 (FIG. 1). In general, an initial charge is between about 10 kilograms and about 200 kilograms of polycrystalline silicon, which may be granular, chunk, chip, or a combination thereof. The mass of the initial charge depends on the desired crystal diameter and hot zone design. Initial charge does not reflect the length of the ingot crystal, because polycrystalline silicon is continuously fed during crystal growth.

A variety of sources of polycrystalline silicon may be used including, for example, granular polycrystalline silicon produced by thermal decomposition of silane or a halosilane in a fluidized bed reactor or polycrystalline silicon produced in a Siemens reactor. As described below, an array of quartz particles (i.e., which may be referred to herein as quartz or glass particles and is meant to include fused quartz particles) may be added to the initial charge 27 of solid-phase polycrystalline silicon in the outer melt zone 42 or the middle melt zone 32 of the crucible assembly 10 prior to melting the initial charge 27 of polycrystalline silicon (or later if a smaller array is added such as in a system capable of feeding larger chunks of silicon).

Once polycrystalline silicon (and the array of quartz particles) is added to the crucible assembly 10 to form a charge 27, the charge 27 is heated to a temperature above about the melting temperature of silicon (e.g., about 1412° C.) to melt the charge, and thereby form a silicon melt 6 (FIG. 3) comprising molten silicon. The silicon melt 6 has an initial volume of molten silicon and has an initial melt elevation level, and these parameters are determined by the size of the initial charge 27. In some embodiments, the crucible assembly 10 comprising the silicon melt 6 is heated to a temperature of at least about 1425° C., at least about 1450° C. or even at least about 1500° C.

The ingot puller apparatus 5 includes a pulling mechanism 114 (FIG. 4) for growing and pulling the ingot 60 from the melt within the inner melt zone 22. The pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a lifting mechanism (e.g., driven pulley or drum, or any other suitable type of lifting mechanism) and the other end is connected to the chuck 120 that holds the seed crystal 122. In operation, the seed crystal 122 is lowered to contact the melt 6 in the inner melt zone 22. The pulling mechanism 114 is operated to cause the seed crystal 122 to rise along pull axis A. This causes a single crystal ingot 60 to be pulled from the melt 6.

Once the charge 27 (FIG. 1) of polycrystalline silicon is liquefied to form a silicon melt 6 (FIG. 3) comprising molten silicon, the silicon seed crystal 122 (FIG. 4) is lowered to contact the melt 6 within the inner melt zone 22. The silicon seed crystal 122 is then withdrawn from the melt 6 with silicon being attached thereto to form a neck 52 thereby forming a melt-solid interface near or at the surface of the melt 6.

The pulling mechanism 114 may rotate the seed crystal 122 and ingot 60 connected thereto. A crucible drive unit 44 may rotate the susceptor 13 and crucible assembly 10. In some embodiments, the silicon seed crystal 122 and the crucible assembly 10 are rotated in opposite directions, i.e., counter-rotation. Counter-rotation achieves convection in the silicon melt 6. Rotation of the seed crystal 122 is mainly used to provide a symmetric temperature profile, suppress angular variation of impurities and also to control crystal melt interface shape.

After formation of the neck 52, an outwardly flaring seed-cone portion 54 (or "crown") adjacent the neck 52 is grown. In general, the pull rate is decreased from the neck portion pull rate to a rate suitable for growing the outwardly flaring seed-cone portion 54. Once the seed-cone portion reaches the target diameter, the main body 56 or "constant-diameter portion" of the ingot 60 is grown. In some embodiments, the main body 56 of the ingot 60 has a diameter of about 150 mm, at least about 150 mm, about 200 mm, at least about 200 mm, about 300 mm, at least about 300 mm, about 450 mm, or even at least about 450 mm.

While the ingot 60 is pulled from the melt 6, solid polysilicon feedstock is added to the outer melt zone 42 through the tube 46 or other channel to replenish the melt 6 in the ingot growth apparatus 5. Solid polycrystalline silicon may be added from a polycrystalline silicon feed system 66 and may be continuously or intermittently added to the ingot puller apparatus 5 to maintain the melt level. Generally, polycrystalline silicon may be metered into the ingot puller apparatus 5 by any method available to those of skill in the art.

In some embodiments, dopant is also added to the melt 6 during ingot growth. Dopant may be introduced from a dopant feed system 72. Dopant may be added as a gas or solid and may be added to the outer melt zone 42.

The apparatus 5 may include a heat shield 116 disposed about the ingot 60 to permit the growing ingot 60 to radiate its latent heat of solidification and thermal flux from the melt 6. The heat shield 116 may be at least partially conical in shape and angles downwardly at an angle to create an annular opening in which the ingot 60 is disposed. A flow of an inert gas, such as argon, is typically provided along the length of the growing crystal. The ingot 60 is pulled through a growth chamber 78 that is sealed from the surrounding atmosphere.

A plurality of independently controlled annular bottom heaters 70 may be disposed in a radial pattern beneath the crucible assembly 10. Annular bottom heaters 70 apply heat in a relatively controlled distribution across the entire base surface area of the crucible assembly 10. The annular bottom heaters 70 may be planar resistive heating elements that are individually controlled. The apparatus 5 may include one or more side heaters 74 disposed radially outward to the crucible assembly 10 to control the temperature distribution through melt 6.

The ingot growth apparatus 5 shown in FIGS. 1-4 and described herein is exemplary and generally any system in which a crystal ingot is prepared by a continuous Czochralski method may be used unless stated otherwise.

In accordance with embodiments of the present disclosure, before the ingot 60 is grown, an array 31 (FIG. 2) of quartz particles is added to the crucible assembly 10. The array 31 may be added to the crucible assembly 10 before heating the polycrystalline silicon 27 to form the silicon melt 6. The array 31 may be positioned on the initial charge 27 of polycrystalline silicon 27 or may be disposed within the charge 27 (e.g., with polycrystalline silicon disposed above and below the charge).

Figure 5:
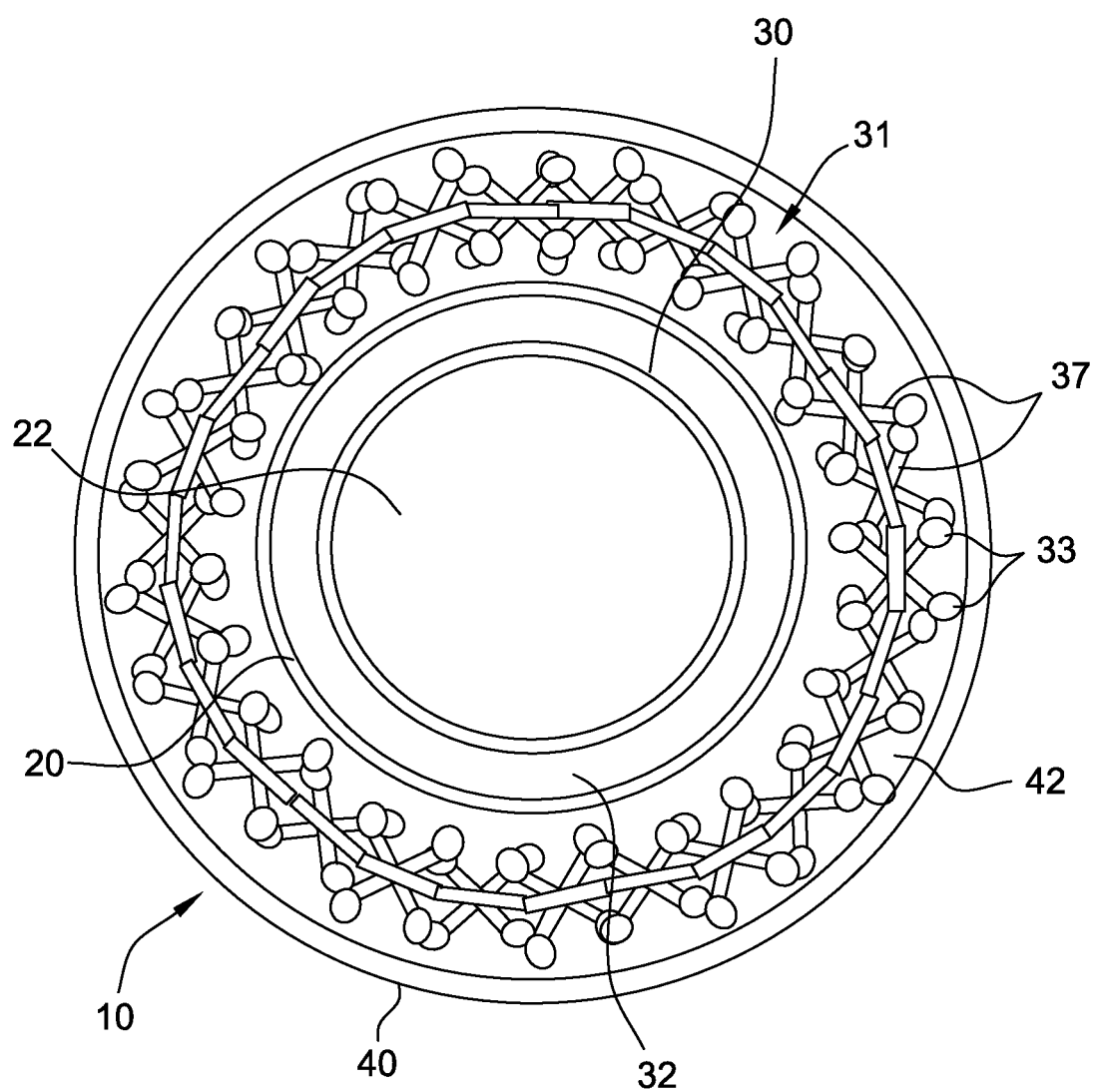
FIG. 5 is a top view of the crucible assembly of the ingot puller apparatus with an array of quartz particles disposed in the outer melt zone.

An example of an array 31 of quartz particles that is disposed in the outer melt zone 42 is shown in FIG. 5. The array 31 includes a plurality of quartz particles 33 and a plurality of linking members 37 that connect adjacent quartz particles 33. The linking members 37 may be made of quartz. The array 31 may be made by 3D printing or by any other suitable method. In methods that involve 3D printing, the array may be built upward from the base with the structure being consolidated or fused layer by layer. In the 3D printing method, the deposition head or fusion source may be capable of translating in an x-y plane to effect consolidation to the final or "green" state of the array. Examples of suitable 3D printing methods that may be used include von Witzendorff et al., "Additive Manufacturing of Glass: $CO_2$-Laser Glass Deposition Printing," Procedia CIRP 74 (2018), 272-275 and Luo et al., "Additive Manufacturing of Glass," Journal of Manufacturing Science and Engineering, vol. 136, 061024: 1-6 (2014), both of which are incorporated herein by reference for all relevant and consistent purposes.

In some embodiments, 3D printing is used to form an array which is a composite and/or incorporated doped materials. For example, the array 31 may be made of quartz that is doped with silicon to reduce surface crystallization of the fused silica.

Figure 6:
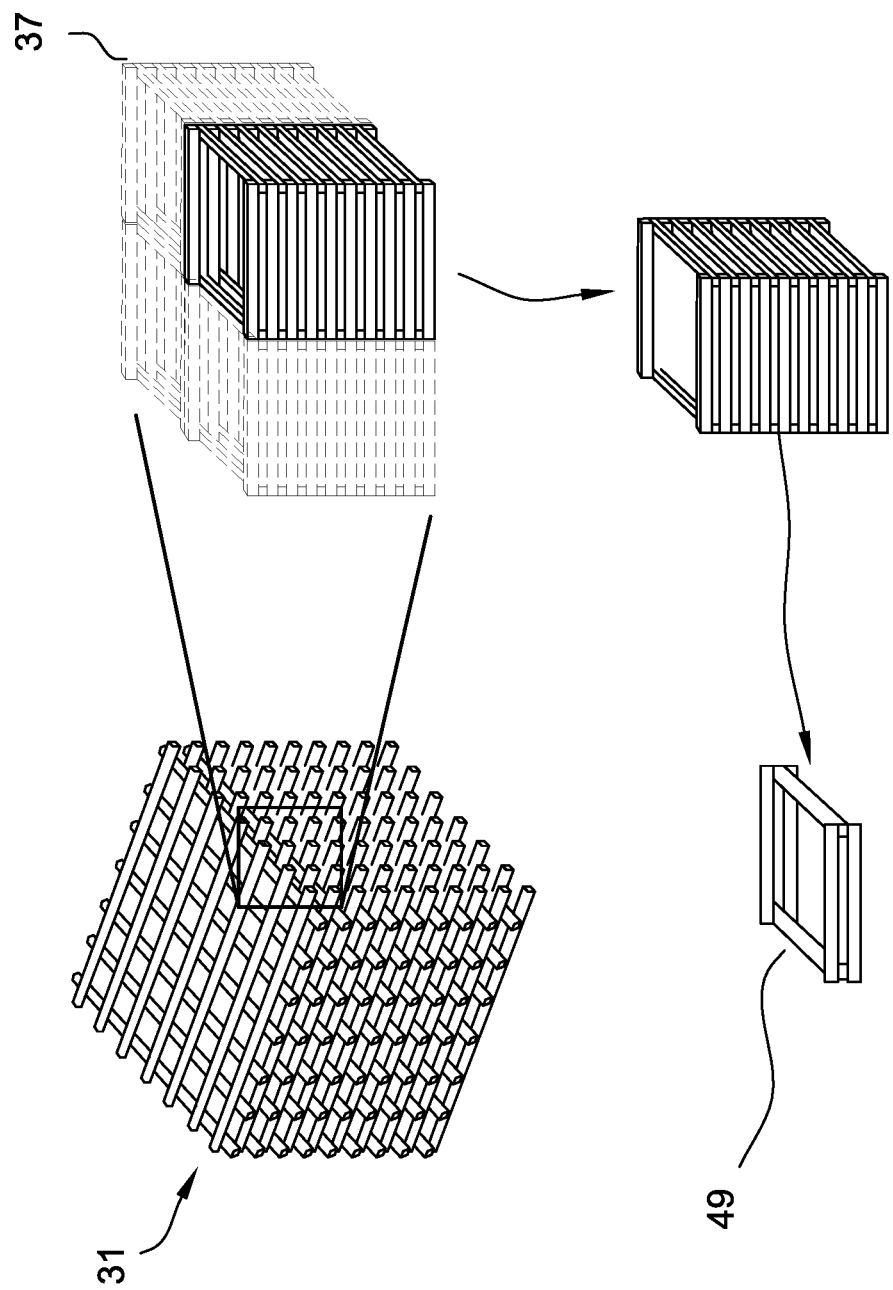
FIG. 6 is a schematic of a process for forming an array of quartz particles.

Another embodiment of an array 31 is shown in FIG. 6. The array 31 includes linking members 37 that are built as a scaffold. The linking members 37 of the array 31 are made of unit cells 49 (e.g., parallelepiped) that may be stacked and linked to form a 3D scaffold. Each scaffold may incorporate a second structure that has a quartz surface area (e.g., through porosity or another structure). The linking members 37 of the unit cells 49 may contain structure within the linking member (i.e., rather than solid bars). For example, the structure 41 shown in FIG. 7 having a quartz particle 33 formed therein may be incorporated within the linking members 37.

Other embodiments of the array 31 include monolithic disks that incorporate the quartz particles. The array 31 may incorporate a porous pattern such as a "basket-weave" pattern or a "bird's nest" pattern (FIG. 5).

Generally, the quartz particles 33 which are incorporated into the array 31 may have any suitable size and shape that allows the array 31 to function as described herein. For example, the quartz particles 33 may be shaped as a rod, tube, sphere or have an irregular shape. In some embodiments, the particles have a size (i.e., largest dimension) between 10 μm and 500 mm. The particles may be sized based on scaffold survivability which is dependent on erosion by the melt and the desired conditioning of the melt.

In some embodiments, the quartz particles 33 of the array 31 have a relatively high surface area. For example, the quartz particles may have a surface area to mass ratio of at least 0.1 $cm^2$ quartz/grams of quartz or at least 0.5 $cm^2$ quartz/grams of quartz (e.g., 0.1 $cm^2$ quartz/grams of quartz to 10 $cm^2$ quartz/grams of quartz). In some embodiments, the quartz particles 33 of the array 31 have a relatively high surface area relative to the amount of silicon in the crucible such as at least 10 $cm^2$ quartz/kg of silicon or at least 50 $cm^2$ quartz/kg of silicon (e.g., 10 $cm^2$ quartz/kg of silicon to 250 $cm^2$ quartz/kg of silicon).

The array 31 may be any size and shape that allows the array to function as described herein. In accordance with some embodiments of the present disclosure, the array 31 of quartz particles may have a sufficient width such that the array 31 continuously extends from the sidewall 40 of the crucible assembly 10 to the first weir 20. In other embodiments, the array 31 has a width less than the distance between the sidewall 40 of the crucible assembly 10 to the first weir 20. In some embodiments, the array 31 has a width between about 50 mm to about 75 mm and/or a height (i.e., depth) between 6 mm and 100 mm.

Figure 7:
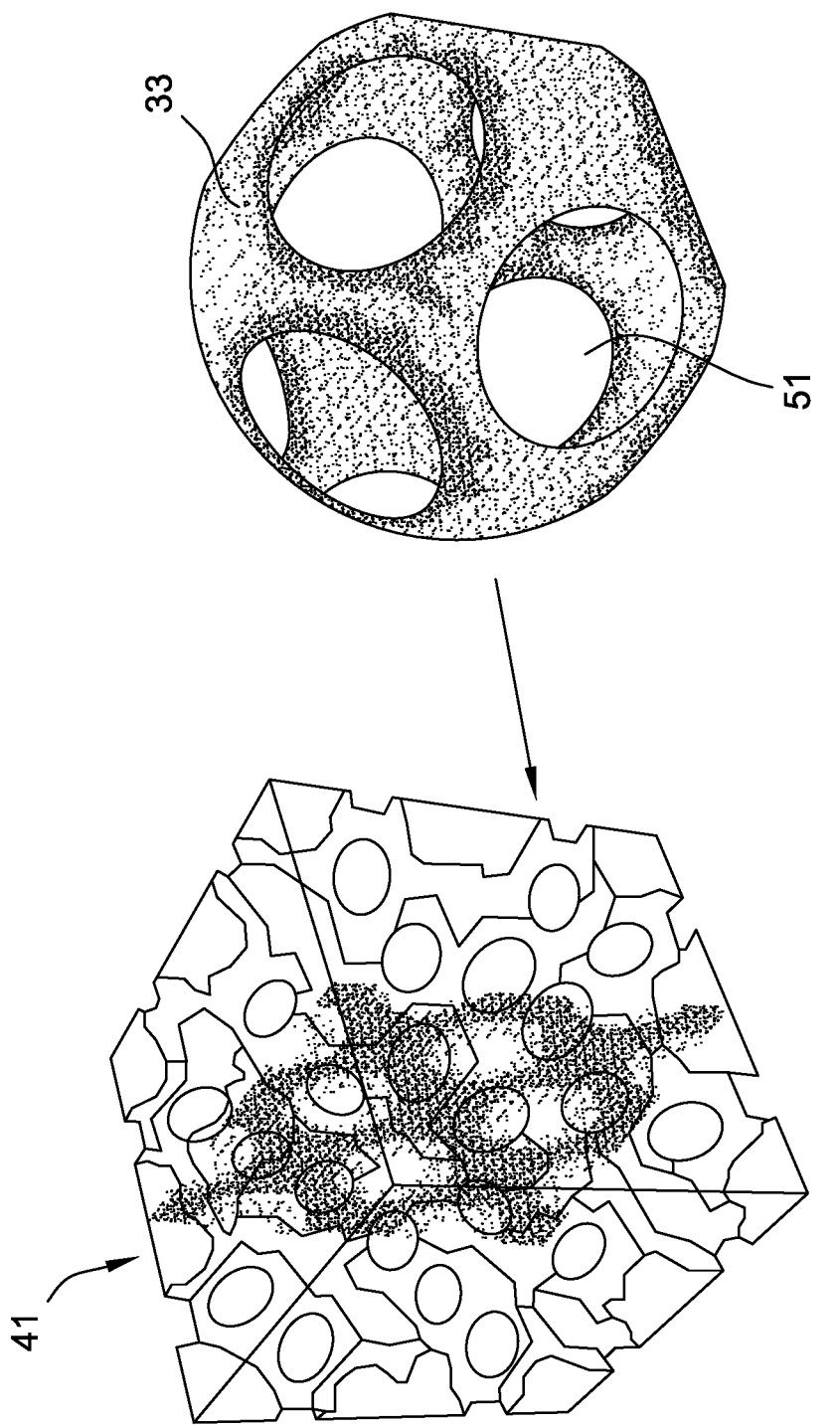
FIG. 7 is a schematic of a quartz structure that may be incorporated into an array.
Figure 8:
FIG. 8 is an embodiment of a quartz particle of the array.
Figure 9:
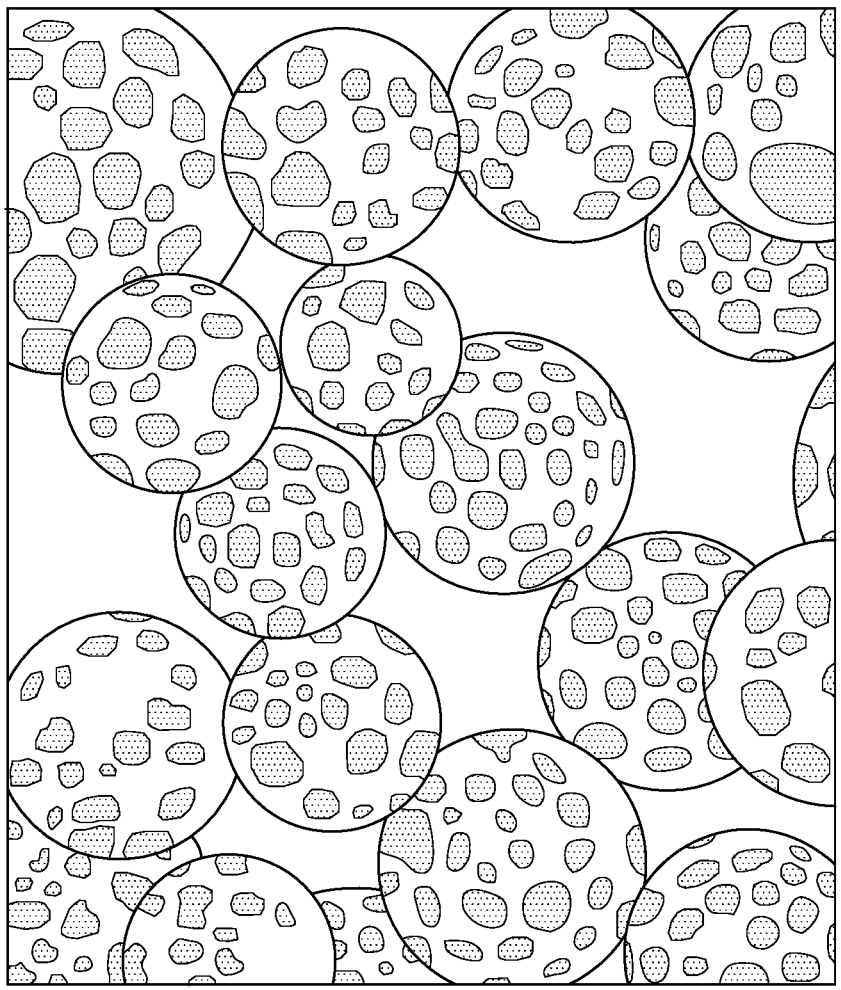
FIG. 9 is another embodiment of quartz particles of the array.
Figure 10:
FIG. 10 is another embodiment of a quartz particle of the array.

An embodiment of a quartz particle 33 for use in an array 31 is shown in FIG. 7. The quartz particle 33 is shaped as a hollow sphere having openings 51 formed therein. In the embodiment illustrated in FIG. 8, the quartz particles 33 include spires which extend from a core of the structure. In the embodiment illustrated in FIG. 9, the quartz particles include dimples which increase the surface area of the particle 33.

The array 31 may be less dense than the melt 6 which allows the array 31 to float on the melt with a portion of the array 31 being disposed above the melt 6. In other embodiments, the array 31 may have a density more similar to the melt such that the array 31 is immersed (or partially immersed) in the melt 6.

In some continuous Czochralski processes, more than one ingot is grown while the hot zone (i.e., lower portion of the apparatus 5 such as the crucible assembly 10 and the susceptor 13) remains heated with silicon melt 6 being continuously within the crucible assembly 10. In such methods, a first ingot is grown to a target length and growth is terminated, the ingot is removed from the ingot puller, and a seed crystal is then lowered into the melt to initiate growth of a second single crystal silicon ingot (i.e., using the same melt from which the first ingot was withdrawn). Subsequent ingots may be grown with the hot zone intact and at temperature with a continuous melt of silicon being within the crucible assembly 10 (e.g., until one or more components of the hot zone have degraded such as the crucible assembly requiring cool-down and replacement of the degraded component). For example, at least 1, 2, 3, 4, 5, 6, 10, or 20 or more ingots may be grown. The array 31 of ingot particles 33 may be present in the crucible assembly 10 during growth of one or more of the subsequently grown ingots (or all subsequently grown ingots while the hot zone is intact).

In some embodiments, no further quartz (e.g., a second array of quartz particles or free-floating quartz) are added to the crucible assembly 10 after the array 31 is positioned in the crucible assembly. For example, no further quartz is added during the entire period at which the hot zone is intact (e.g., during growth of subsequent ingots). In other embodiment, additional amounts of quartz are added during ingot growth (e.g., after the first ingot is grown).

Compared to conventional methods for forming single crystal silicon ingots, methods of the present disclosure have several advantages. Without being bound by any particular theory, it is believed that addition of polycrystalline silicon into the outer melt zone of the crucible assembly creates relatively small bubbles (e.g., less than 10 μm) of the inert gas (e.g., argon) that can be carried by the melt through the openings within each weir which allows bubbles to reach the silicon-melt interface. The array of quartz particles provides surface area and nucleation points for inert gas bubbles to aggregate, thereby increasing the size of the bubbles to allow them to become more buoyant. The array or particles provide a monolithic layer of quartz on the surface of the melt (e.g. with less gaps relative to non-arrayed quartz cullets). The array dissolves an amount after melt formation and the dissolved quartz helps remove inert gas from the melt. The array may be placed in the crucible assembly relatively easily before the hot zone is up to temperature (e.g., placed on the initial charge of polycrystalline silicon). Use of an array keeps the quartz particles dispersed and increases the surface area exposed to the melt, thereby better sweeping the melt of argon. The quartz particles may be configured to have a relatively high surface area compared to quartz cullets. Interconnected small feature sizes allow for increased $SiO_2$ dissolution (due to increase surface area) but with limited coalescence.

In embodiments in which the array is made by 3D printing, the surface area of the quartz particles may be increased and the particles may be interconnected in an array. 3D printing allows binders which are used in glass production to be eliminated. 3D printing allows the array to be tailored along its thickness such that regions of the array which dissolve faster due to proximity to the melt free surface may be optimized for structure integrity and SiO yield, while sections which are submerged in the melt may also be tailored to have a spacing and cross-section such that the dissolution by the melt does not render the structure unstable. The cross-sectional taper can be tailored so as to maintain the connectivity of the structure to provide sufficient surface to optimize silica production (e.g., thicker at the junction points and thinner on peripheral areas which keeps the array intact and retains array spacing). 3D printing allows a larger wall structure to be produced, where the actual structure of the wall can act as a SiO(g) generator and particle filter. Conversely, smaller macro-dimensions spheres can be produced thereby preserving the porosity to generate SiO(g) at a high rate. 3D printing could be used to yield fully dense materials that may be integrated with a porous structure (e.g., a fully dense outer shell with a porous inner core or, conversely, a fully dense inner shell with a porous outer shell depending on the evolution of the array during crystal growth).

EXAMPLES

The processes of the present disclosure are further illustrated by the following Examples. These Examples should not be viewed in a limiting sense.

Example 1: Increase in Quartz Particle Spacing in Conventional Methods

Figure 11:
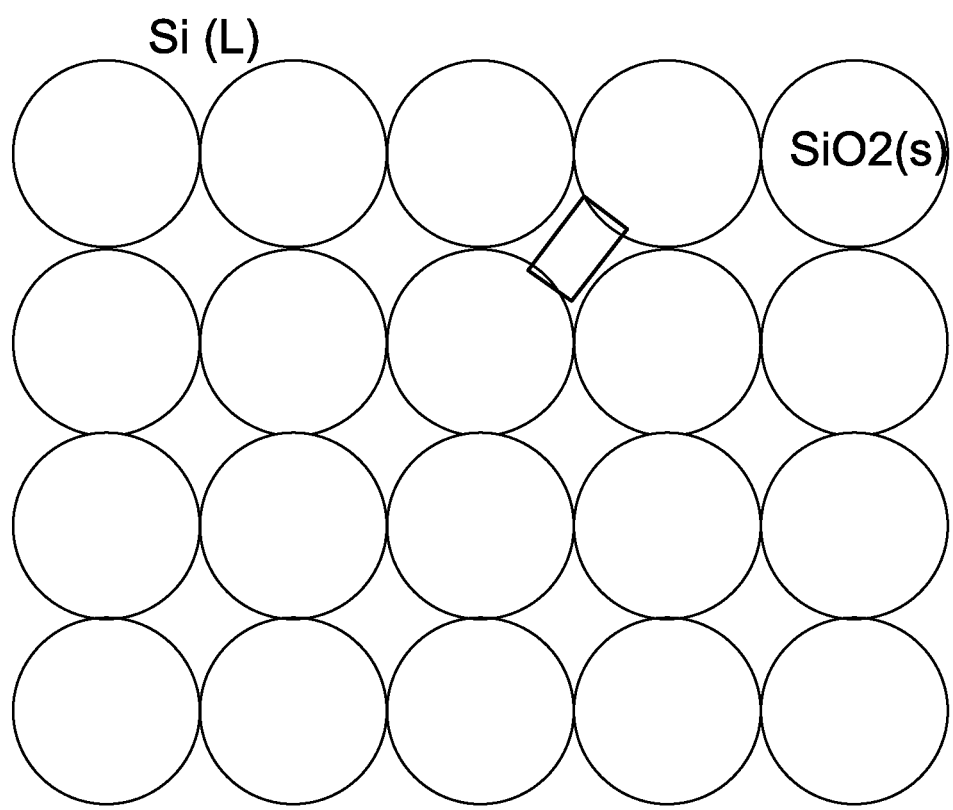
FIG. 11 is a schematic of quartz cullets in a silicon melt.
Figure 12:
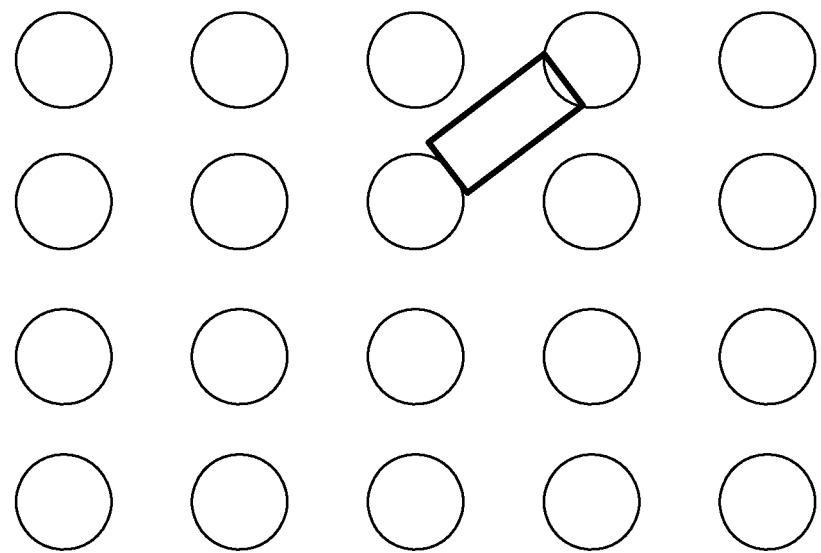
FIG. 12 is a schematic of the quartz cullets after partial dissolution thereof.
Figure 13:
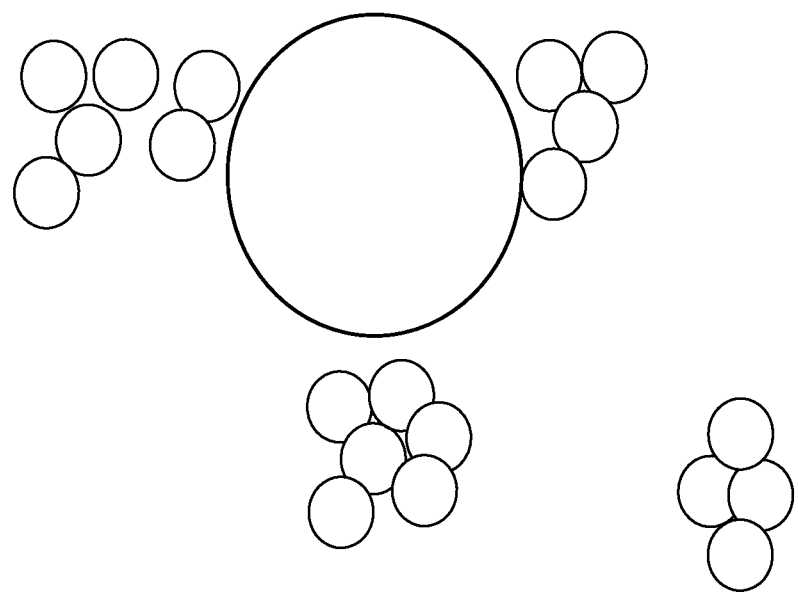
FIG. 13 is a schematic of the quartz cullets after coalescence.

FIGS. 11-13 schematically show conventional cylindrical quartz particles after addition to a silicon melt (e.g., in the outer melt zone of the crucible assembly). In FIG. 11, after addition of the cullets, there is a depth of quartz which has some open porosity due to natural packing of the surfaces. As the crystal pulling growth progresses (FIG. 12), cross-sections of the quartz surfaces are reduced and the distance between quartz pieces widens. As dissolution of quartz into the melt progresses (FIG. 13), the cullets begin to coalesce. The coalescence results in a more open pathway for the silicon melt.

Because quartz ($SiO_2$) dissolves to produce dissolved SiO which in turn can nucleate a SiO bubble, an interaction volume can be defined as shown in the highlighted regions between the quartz shapes in FIGS. 11 and 12. The so-called interaction volume allows for sufficient production of SiO bubbles which can capture argon and which are annihilated at the melt free surface. It can be seen that as the shapes are dissolved, the cross-section is reduced, and when the shapes become sufficiently small and mobile, the shapes coalescence (FIG. 13). This opens the spacing between the shapes resulting in clusters. The physical events of dissolution and coalescence result in changes to the concentration of dissolved SiO in the melt represented by the interaction volume which alters the effectiveness of argon removal by bubble nucleation.

Figure 14:
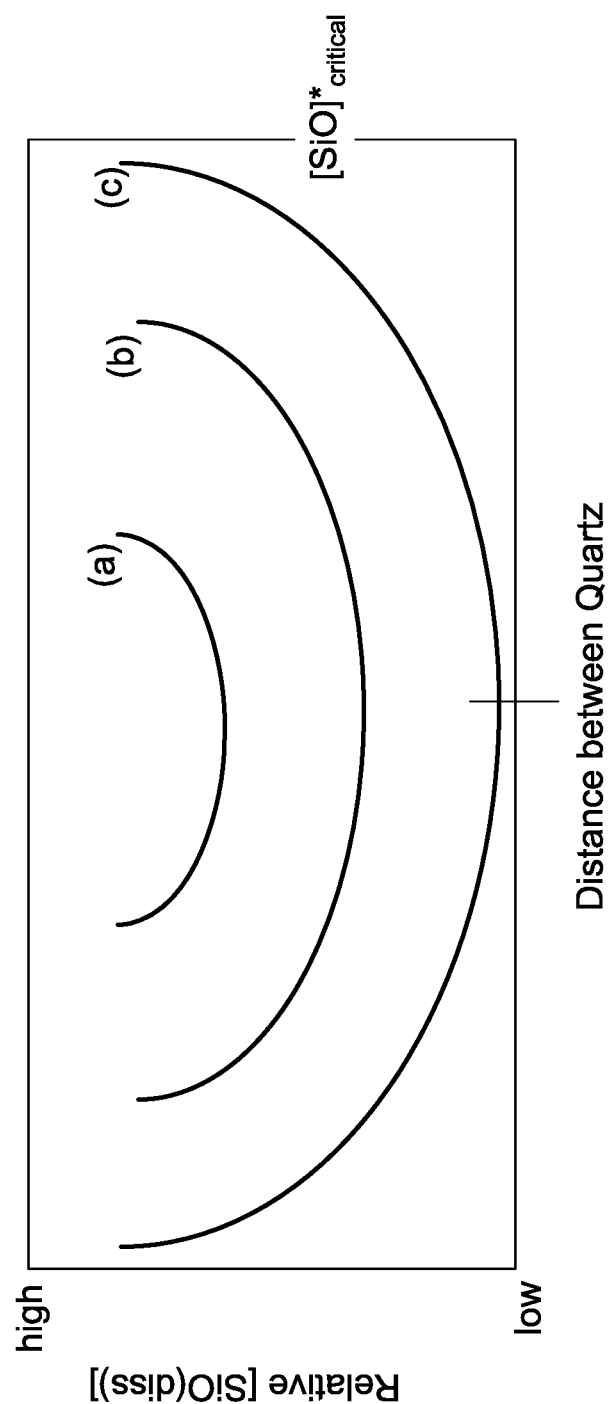
FIG. 14 is a graph of the relative concentration of SiO dissolved in the silicon melt for the cullet spacing shown in each of FIGS. 11-13.

A schematic of hypothesized profiles is shown in FIG. 14, with the 3 matching cases of FIGS. 11-13 ("a", "b" and "c", respectively). FIG. 14 shows the relative concentration of SiO dissolved in the silicon melt for the different spacing of quartz shapes. There is a critical concentration ("$[SiO]^*_{critical}$") below which a bubble cannot nucleate, grow, collect argon gas and reduce grown in voids. As shown in FIG. 14, the spatial layout of the dissolving quartz shapes impacts the ability of the particles to sustain operable mechanisms for void reduction.

The generation of SiO proceeds by the following reaction between the quartz shapes and the silicon liquid:

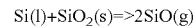

$$Si(l) + SiO_2(s) \Longrightarrow 2SiO(g)$$

Figure 15:
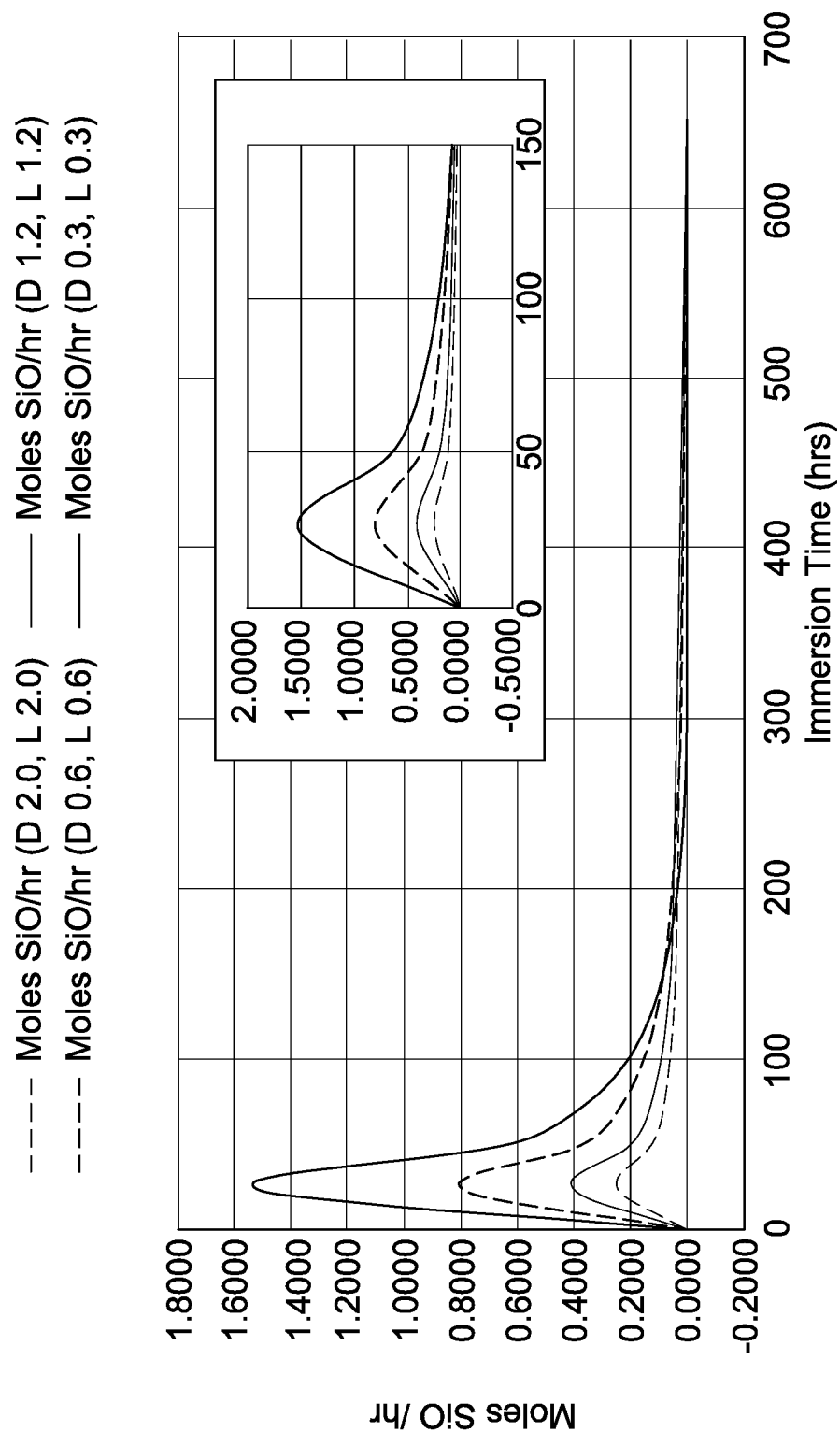
FIG. 15 is a graph showing the incremental moles of SiO (g) generated as a function of immersion time in a silicon melt for four cases of different lengths and diameters of quartz rods.

The mass of the $SiO_2$ that dissolves into the silicon melt is proportional to the amount of SiO(g) generated. Using a literature average value of 10 μm/hr for the dissolution of $SiO_2$ into a silicon liquid, the incremental mole generation rate at a total elapsed time of immersion was calculated as a function of the total mass of quartz shapes added as well as the surface area of the shapes. In the simulation of FIG. 15, a total mass of 5 kg of quartz shapes was used, and the feature sizes for the diameter and length of a rod are shown as D and L respectively. Four cases of 2 cm, 1.2 cm, 0.6 cm and 0.3 cm for L and D are shown. An increased generation rate of SiO(g) occurs for smaller feature sizes. However, the compromising situation is the coalescence effect which allows for regions in the silicon melt which can by-pass the conditioning action of the SiO(g) to reduce large area void defects.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for forming a single crystal silicon ingot comprising:
   adding solid-phase polycrystalline silicon to a crucible assembly;
   adding an array of quartz particles to the crucible assembly, the array comprising a plurality of quartz particles and a plurality of linking members that connect adjacent quartz particles, wherein each quartz particle of the array is connected to a linking member;
   heating the polycrystalline silicon to form a silicon melt;
   contacting the silicon melt with a seed crystal; and
   withdrawing the seed crystal from the silicon melt to form a silicon ingot, wherein the array of quartz particles maintains dispersion of quartz particles during ingot growth.

2. The method as set forth in claim 1 wherein the array is added to the crucible assembly before heating the polycrystalline silicon to form the silicon melt.

3. The method as set forth in claim 1 wherein the array has a width between about 50 mm to about 75 mm and a depth between 6 mm and 100 mm.

4. The method as set forth in claim 3 wherein the linking members are made of quartz.

5. The method as set forth in claim 1 wherein the quartz particles are shaped as a rod, tube, sphere or have an irregular shape.

6. The method as set forth in claim 1 wherein the array is made by 3D printing.

7. The method as set forth in claim 1 wherein the array comprises a 3D scaffold.

8. The method as set forth in claim 1 wherein the quartz particles have a surface area to mass ratio of at least $0.1\ cm^2$ quartz/grams of quartz.

9. The method as set forth in claim 1 wherein the quartz particles have a surface area to mass ratio of at least $0.5\ cm^2$ quartz/grams of quartz.

10. The method as set forth in claim 1 wherein the quartz particles have a surface area to mass ratio of from $0.1\ cm^2$ quartz/grams of quartz to $10\ cm^2$ quartz/grams of quartz.

11. The method as set forth in claim 1 wherein the quartz particles have a surface area to silicon charge ratio of at least $10\ cm^2$ quartz/kg of silicon.

12. The method as set forth in claim 1 wherein the quartz particles have a surface area to silicon charge ratio of at least $50\ cm^2$ quartz/kg of silicon.

13. The method as set forth in claim 1 wherein the quartz particles have a surface area to silicon charge ratio of from $10\ cm^2$ quartz/kg of silicon to $250\ cm^2$ quartz/kg of silicon.

14. The method as set forth in claim 1 wherein the crucible assembly comprises a weir and a sidewall that define an outer melt zone between the weir and the sidewall, the array being added to the outer melt zone.

15. The method as set forth in claim 14 wherein the weir is a first weir, the crucible assembly comprising a second weir radially inward to the first weir, the first weir and second weir defining a middle melt zone between the first weir and the second weir, the second weir defining an inner melt zone within the second weir.

16. The method as set forth in claim 1 wherein the crucible assembly comprises a first weir, second weir radially inward to the first weir, and a sidewall, the first weir and sidewall defining an outer melt zone between the first weir and sidewall, the first weir and second weir defining a middle melt zone between the first weir and the second weir, the second weir defining an inner melt zone within the second weir, the array being added to the middle melt zone.

17. The method as set forth in claim 1 wherein the silicon ingot is grown in a continuous Czochralski process in which polycrystalline silicon is added to the melt during ingot growth.

18. The method as set forth in claim 17 wherein quartz is not added to the melt during ingot growth.

19. A method for forming a single crystal silicon ingot comprising:
   adding solid-phase polycrystalline silicon to a crucible assembly;
   adding an array of quartz particles to the crucible assembly, the array comprising a plurality of quartz particles and a plurality of linking members that connect adjacent quartz particles, the linking members being solid bars;
   heating the polycrystalline silicon to form a silicon melt;
   contacting the silicon melt with a seed crystal; and
   withdrawing the seed crystal from the silicon melt to form a silicon ingot.

20. A method for forming a single crystal silicon ingot comprising:
   adding solid-phase polycrystalline silicon to a crucible assembly;
   adding an array of quartz particles to the crucible assembly, the array comprising a plurality of quartz particles and a plurality of linking members that connect adjacent quartz particles, the linking members forming a scaffold, the scaffold incorporating a second structure having a quartz surface area within the scaffold;
   heating the polycrystalline silicon to form a silicon melt;
   contacting the silicon melt with a seed crystal; and
   withdrawing the seed crystal from the silicon melt to form a silicon ingot.

* * * * *